US011003460B2

United States Patent
Lai et al.

(10) Patent No.: US 11,003,460 B2
(45) Date of Patent: May 11, 2021

(54) MEMORY CONTROL CIRCUIT UNIT, MEMORY STORAGE DEVICE AND CONTROL METHOD THEREOF

(71) Applicant: PHISON ELECTRONICS CORP., Miaoli (TW)

(72) Inventors: Ming-Fu Lai, Miaoli (TW); Ying-Fu Chao, Miaoli (TW); Chao-Ta Huang, Miaoli (TW); Chun-Yu Ling, Miaoli (TW)

(73) Assignee: PHISON ELECTRONICS CORP., Miaoli (TW)

( * ) Notice: Subject to any disclaimer, the term of this patent is extended or adjusted under 35 U.S.C. 154(b) by 301 days.

(21) Appl. No.: 15/690,215

(22) Filed: Aug. 29, 2017

(65) Prior Publication Data
US 2019/0012180 A1    Jan. 10, 2019

(30) Foreign Application Priority Data
Jul. 7, 2017  (TW) ................................ 106122801

(51) Int. Cl.
| | | |
|---|---|---|
| G06F 9/4401 | (2018.01) | |
| G06F 9/445 | (2018.01) | |
| G06F 11/14 | (2006.01) | |
| G06F 12/16 | (2006.01) | |
| G11C 16/08 | (2006.01) | |
| G11C 16/20 | (2006.01) | |
| G11C 16/22 | (2006.01) | |

(52) U.S. Cl.
CPC ............ *G06F 9/4403* (2013.01); *G06F 9/445* (2013.01); *G06F 9/4408* (2013.01); *G06F 11/1417* (2013.01); *G06F 12/16* (2013.01); *G11C 16/08* (2013.01); *G11C 16/20* (2013.01); *G11C 16/22* (2013.01)

(58) Field of Classification Search
None
See application file for complete search history.

(56) References Cited

U.S. PATENT DOCUMENTS

| | | | | |
|---|---|---|---|---|
| 7,190,190 | B1 * | 3/2007 | Camarota | G11C 7/20 |
| | | | | 326/37 |
| 7,757,276 | B1 * | 7/2010 | Lear | H04L 63/126 |
| | | | | 726/10 |
| 8,782,389 | B2 * | 7/2014 | Dolgunov | G06F 21/80 |
| | | | | 713/1 |
| 8,996,851 | B2 * | 3/2015 | Dolgunov | G06F 9/4406 |
| | | | | 713/164 |
| 9,613,214 | B2 * | 4/2017 | Dover | G06F 21/57 |
| 2007/0118880 | A1 * | 5/2007 | Mauro, II | G06F 21/79 |
| | | | | 726/4 |
| 2008/0140600 | A1 * | 6/2008 | Pandya | G11C 15/00 |
| | | | | 706/47 |

(Continued)

*Primary Examiner* — Jaweed A Abbaszadeh
*Assistant Examiner* — Cheri L Harrington
(74) *Attorney, Agent, or Firm* — JCIPRNET (57) ABSTRACT

A control method of a memory storage device is provided and includes: detecting a first signal stream controlled by a host system; executing a boot code according to the first signal stream and entering a boot code mode; and receiving a command from the host system in the boot code mode and not executing a firmware code stored in a rewritable non-volatile memory module in the memory storage device. According, operational flexibility of the memory storage device may be enhanced.

27 Claims, 9 Drawing Sheets

(56) References Cited

U.S. PATENT DOCUMENTS

| | | | | |
|---|---|---|---|---|
| 2008/0301358 A1* | 12/2008 | Wen | ............................ | G06F 8/65 |
| | | | | 711/103 |
| 2010/0268928 A1* | 10/2010 | Wang | ................... | G06F 12/0866 |
| | | | | 713/2 |
| 2013/0268746 A1* | 10/2013 | Hsu | ........................ | G06F 21/572 |
| | | | | 713/2 |
| 2014/0129820 A1* | 5/2014 | Lim | ......................... | G06F 8/654 |
| | | | | 713/2 |
| 2014/0304497 A1* | 10/2014 | Park | ...................... | G06F 9/4406 |
| | | | | 713/2 |
| 2014/0359352 A1* | 12/2014 | DiMarzio, Jr. | ...... | G06F 11/1469 |
| | | | | 714/15 |
| 2016/0188430 A1* | 6/2016 | Nitta | .......................... | G06F 8/65 |
| | | | | 714/6.3 |
| 2016/0210161 A1* | 7/2016 | Rosset | ................. | G06F 11/1417 |
| 2018/0188986 A1* | 7/2018 | Webster | ................. | G06F 3/0622 |
| 2019/0012464 A1* | 1/2019 | Ye | ........................... | G06F 21/575 |

\* cited by examiner

MEMORY CONTROL CIRCUIT UNIT, MEMORY STORAGE DEVICE AND CONTROL METHOD THEREOF

CROSS-REFERENCE TO RELATED APPLICATION

This application claims the priority benefit of Taiwan application serial no. 106122801, filed on Jul. 7, 2017. The entirety of the above-mentioned patent application is hereby incorporated by reference herein and made a part of this specification.

BACKGROUND

Technology Field

The disclosure relates to a memory control circuit unit, a memory storage device and a control method thereof.

Description of Related Art

The markets of digital cameras, cellular phones, and MP 3 players have expanded rapidly in recent years, resulting in escalated demand for storage media by consumers. The characteristics of data non-volatility, low power consumption, compact size, and no mechanical structure make the rewritable non-volatile memory module (e.g., flash memory) ideal for being built in the portable multi-media devices as cited above.

Generally, a memory storage device is required to establish a connection with a host system. During a stage of establishing connection, the memory storage device and the host system perform a handshake operation, so as to ensure whether the respective clocks are synchronized and/or to transmit various handshake messages. The memory storage device is equipped with the ability to identify a command from the host system and to communicate with the host system after the connection is established. Nevertheless, under certain circumstances, for example, a setting of a connection parameter of the host system or the memory storage device is incorrect or a firmware of the memory storage device is damaged; accordingly, the connection between the memory storage device and the host system may not be successfully established. As a result, the memory storage device is unable to communicate with the host system.

In order to solve aforementioned problems, an engineering pin is generally preserved on a mainboard of the memory storage device. When it is required to enter a boot code mode, an engineer has to disassemble the memory storage device by using tools and manually connect the engineering pin to the ground, so as to force the memory storage device to enter the boot code mode and perform debugging in the boot code mode. Nevertheless, such approach is not necessarily applicable to all types of the memory storage devices. In addition, disassembling the memory storage device is troublesome and may lead to hardware damage or other problems easily.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a memory control circuit unit, a memory storage device and a control method thereof, which are capable of controlling the memory storage device with better flexibility.

An exemplary embodiment of the disclosure provides a memory control circuit unit configured to control a memory storage device. The memory control circuit unit includes a host interface, a memory interface, a signal detection circuit, and a memory management circuit. The host interface is configured to be coupled to a host system. The memory interface is configured to be coupled to a rewritable non-volatile memory module of the memory storage device. The memory management circuit is coupled to the host interface, the memory interface, and the signal detection circuit. The signal detection circuit is configured to detect a first signal stream controlled by the host system. The memory management circuit is further configured to execute a boot code according to the first signal stream and to enter a boot code mode. After entering the boot code mode, the memory management circuit is further configured to receive a command from the host system in the boot code mode and not to execute a firmware code stored in the rewritable non-volatile memory module.

Another exemplary embodiment of the disclosure provides a memory storage device including a connection interface unit, a rewritable non-volatile memory module, and a memory control circuit unit. The connection interface unit is configured to be coupled to a host system. The memory control circuit unit is coupled to the connection interface unit and the rewritable non-volatile memory module. The memory control circuit unit is configured to detect a first signal stream controlled by the host system. The memory control circuit unit is further configured to execute a boot code according to the first signal stream and enter a boot code mode. After entering the boot code mode, the memory control circuit unit is further configured to receive a command from the host system in the boot code mode and not to execute a firmware code stored in the rewritable non-volatile memory module.

Another exemplary embodiment of the disclosure provides a control method for controlling a memory storage device including a rewritable non-volatile memory module. The control method includes: detecting a first signal stream controlled by a host system; executing a boot code according to the first signal stream and entering a boot code mode of the memory storage device; and receiving a command from the host system and not executing a firmware code stored in the rewritable non-volatile memory module after entering the boot code mode.

To sum up, after the first signal stream controlled by the host system is detected, the memory storage device executes the boot code and enters the boot code mode. Next, the memory storage device may receive and identify the command from the host system in the boot code mode. Particularly, after entering the boot code mode based on the first signal stream, the firmware code stored in the rewritable non-volatile memory module of the memory storage device is not executed, so as to prevent the influence from damaged firmware code or the firmware code which is not yet set. According, the memory storage device may be controlled with better flexibility.

To make the above features and advantages of the present disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Herein, several exemplary embodiments of the disclosure are introduced to describe the disclosure; however the disclosure is not limited by the exemplary embodiments. Suitable combinations among the exemplary embodiments are also allowed. The term "coupled to" used throughout the embodiments (including claims) may refer to any direct and indirect connection means. For example, if a first device is described as being coupled to a second device in the embodiments, the sentence should be explained as the first device may be connected to the second device directly, or the first device may, through any other device or through certain connection means, be connected to the second device indirectly. In addition, the word "signal" may refer to at least one current, voltage, electric charge, temperature, data, or any other signal or signals.

Generally, a memory storage device (also called a memory storage system) includes a rewritable non-volatile memory module and a controller (also called a control circuit). The memory storage device is usually configured together with a host system so that the host system may write data into the memory storage device or read data from the memory storage device.

Figure 1:
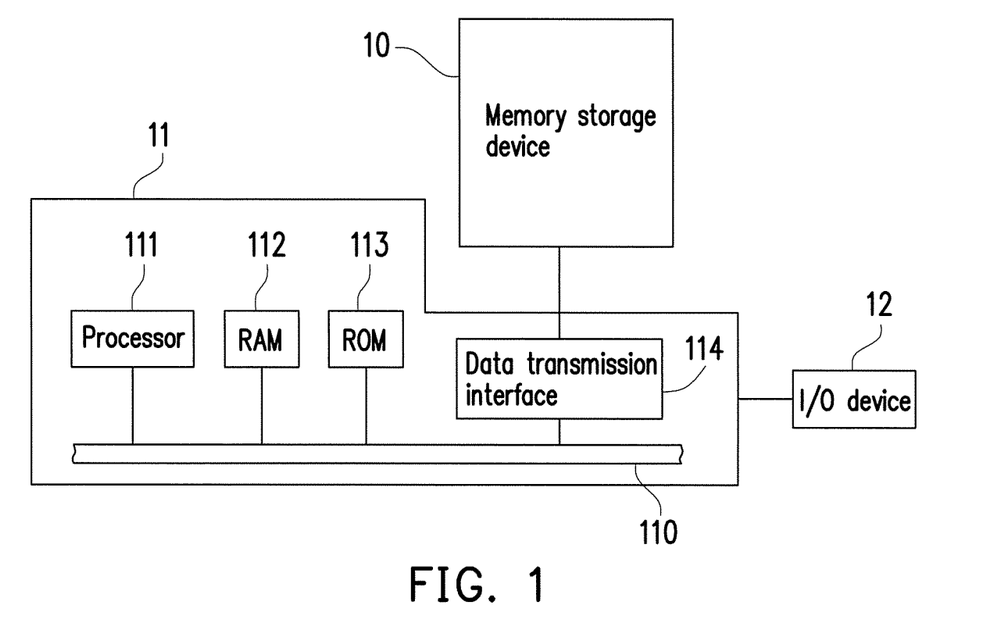
FIG. 1 is a schematic diagram illustrating a host system, a memory storage device, and an input/output (I/O) device according to an exemplary embodiment of the disclosure.
Figure 2:
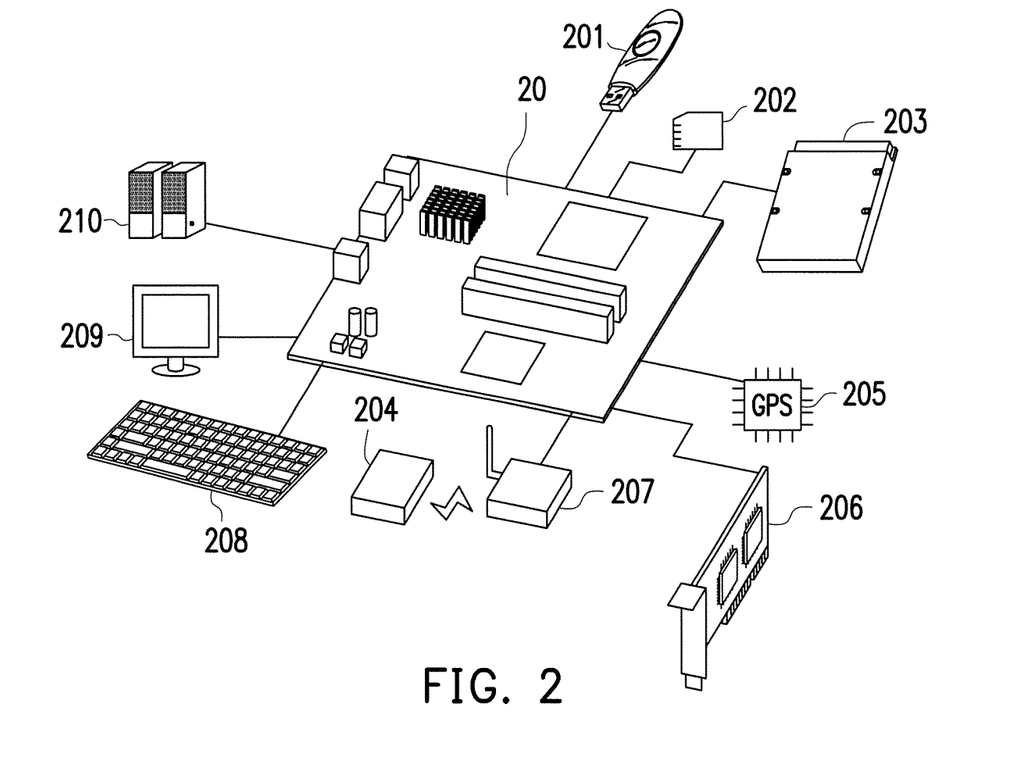
FIG. 2 is a schematic diagram illustrating a host system, a memory storage device, and an I/O device according to another exemplary embodiment of the disclosure.

FIG. 1 is a schematic diagram illustrating a host system, a memory storage device, and an input/output (I/O) device according to an exemplary embodiment of the disclosure. FIG. 2 is a schematic diagram illustrating a host system, a memory storage device, and an I/O device according to another exemplary embodiment of the disclosure.

Referring to FIG. 1 and FIG. 2 together, a host system 11 generally includes a processor 111, a random access memory (RAM) 112, a read only memory (ROM) 113, and a data transmission interface 114. The processor 111, the random access memory 112, the read only memory 113, and the data transmission interface 114 are all coupled to a system bus 110.

In this exemplary embodiment, the host system 11 is coupled to a memory storage device 10 through the data transmission interface 114. For instance, the host system 11 is able to store data to the memory storage device 10 or read data from the memory storage device 10 through the data transmission interface 114. Further, the host system 11 is coupled to an I/O device 12 through the system bus 110. For example, the host system 11 can send output signals to the I/O device 12 or receive input signals from the I/0 device 12 through the system bus 110.

In this exemplary embodiment, the processor 111, the random access memory 112, the read only memory 113, and the data transmission interface 114 may be disposed on a mainboard 20 of the host system 11. A number of the data transmission interface 114 may be one or more. Through the data transmission interface 114, the mainboard 20 may be coupled to the memory storage device 10 in a wired manner or a wireless manner. The memory storage device 10 may be, for example, a flash drive 201, a memory card 202, a solid state drive (SSD) 203, or a wireless memory storage device 204. The wireless storage device 204 may be, for example, a memory storage device based on various wireless communication technologies, such as a near field communication (NFC) memory storage device, a wireless fidelity (WiFi) memory storage device, a bluetooth memory storage device, or a low energy bluetooth memory storage device (e.g., iBeacon). Besides, the mainboard 20 may also be coupled to various I/O devices including a global positioning system (GPS) module 205, a network interface card 206, a wireless transmission device 207, a keyboard 208, a monitor 209, and a speaker 210 through the system bus 110. For example, in an exemplary embodiment, the mainboard 20 can access the wireless memory storage device 204 through the wireless transmission device 207.

Figure 3:
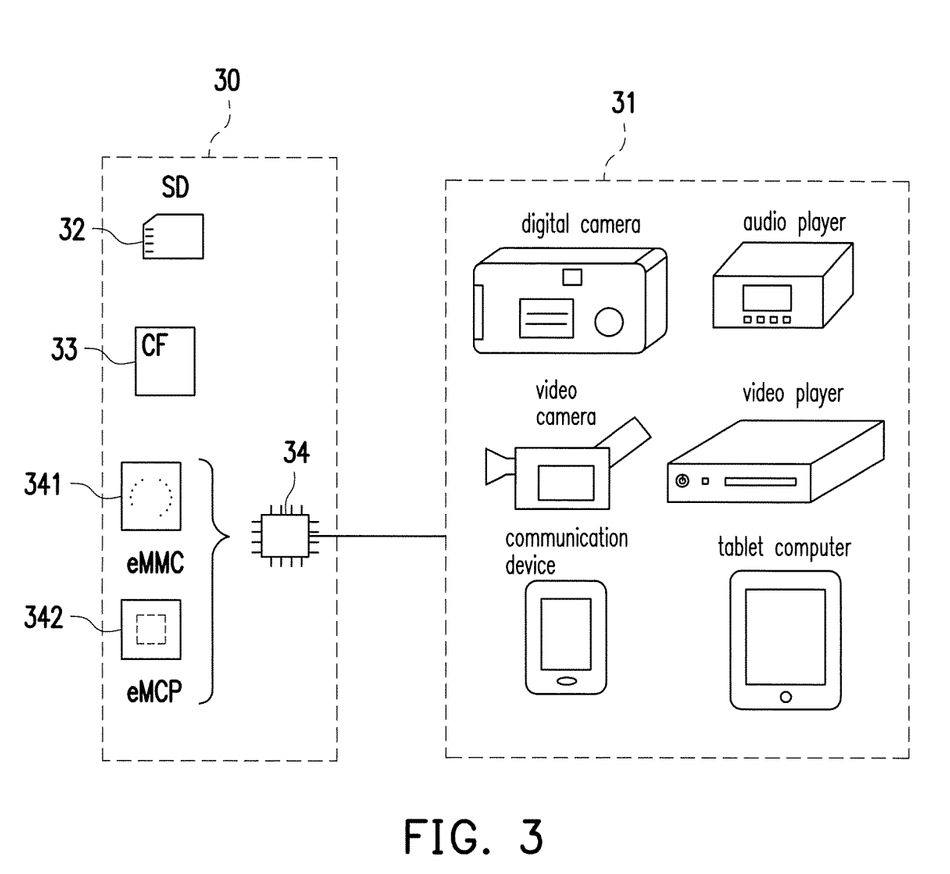
FIG. 3 is a schematic diagram illustrating a host system and a memory storage device according to another exemplary embodiment of the disclosure.

In an exemplary embodiment, aforementioned host system may be any systems capable of substantially cooperating with the memory storage device for storing data. Although the host system is illustrated as a computer system in foregoing exemplary embodiment; nevertheless, FIG. 3 is a schematic diagram illustrating a host system and a memory storage device according to another exemplary embodiment of the disclosure. Referring to FIG. 3, in another exemplary embodiment, a host system 31 may also be a system including a digital camera, a video camera, a communication device, an audio player, a video player or a tablet computer, whereas a memory storage device 30 can be various non-volatile memory storage devices used by the host system 31, such as a secure digital (SD) card 32, a compact flash (CF) card 33, or an embedded storage device 34. The embedded storage device 34 includes various embedded storage devices capable of directly coupling a memory module onto a substrate of the host system, such as an embedded Multi Media Card (eMMC) 341 and/or embedded Multi Chip Package (eMCP) storage device 342.

Figure 4:
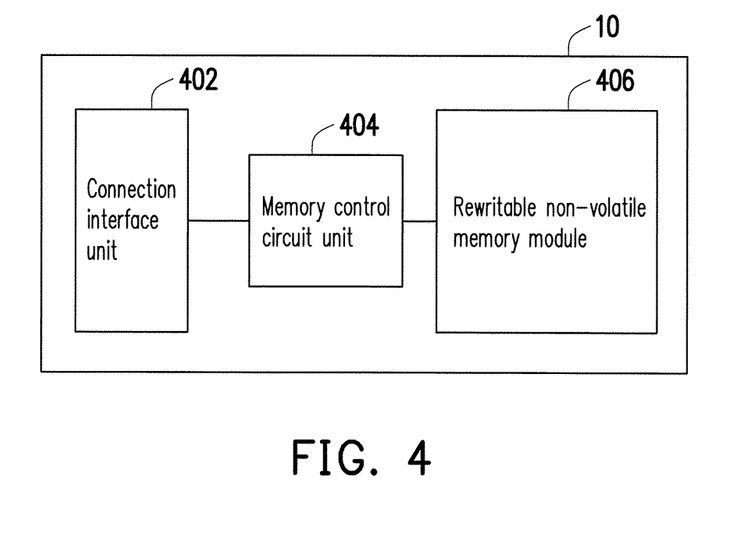
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404 and a rewritable non-volatile memory module 406.

The connection interface unit 402 is configured to couple the memory storage device 10 to the host system 11. In this exemplary embodiment, the connection interface unit 402 is compatible with a Serial Advanced Technology Attachment (SATA) standard. However, it should be noted that the disclosure is not limited thereto, and the connection interface unit 402 may also comply with the Parallel Advanced Technology Attachment (PATA) standard, the Institute of Electrical and Electronic Engineers (IEEE) 1394 standard, the Peripheral Component Interconnect Express (PCI Express) standard, the Universal Serial Bus (USB) standard, the Secure Digital (SD) interface standard, the Ultra High Speed-I (UHS-I) interface standard, the Ultra High Speed-II (UHS-II) interface standard, the Memory Stick (MS) interface standard, the Multi Media Card (MMC) interface standard, the Embedded Multimedia Card (eMMC) interface standard, the Universal Flash Storage (UFS) interface standard, the Compact Flash (CF) interface standard, the Integrated Device Electronics (IDE) interface standard, or other suitable standards. The connection interface unit 402 may be packaged in a chip together with the memory control circuit unit 404, or the connection interface unit 402 may be disposed outside a chip including the memory control circuit unit 404.

The memory control circuit unit 404 is configured to execute a plurality of logic gates or control instructions which are implemented in form of hardware or firmware and to execute operations of writing, reading or erasing data in the rewritable non-volatile memory module 406 according to the commands of the host system 11.

The rewritable non-volatile memory module 406 is coupled to the memory control circuit unit 404 for storing data written by the host system 11. The rewritable non-volatile memory module 406 may be a single level cell (SLC) NAND flash memory module (i.e., a flash memory module in which one memory cell stores 1 bit of data), a multi level cell (MLC) NAND flash memory module (i.e., a flash memory module in which one memory cell stores 2 bits of data), a triple level cell (TLC) NAND flash memory module (i.e., a flash memory module in which one memory cell stores 3 bits of data), other types of flash memory modules, or other memory modules having the same characteristics.

Each memory cell in the rewritable non-volatile memory module 406 stores one bit or more bits by change of a voltage (referred to as "threshold voltage" hereinafter). Specifically, a charge trapping layer exists between a control gate of each memory cell and a channel. By applying a write voltage to the control gate, an electron amount of the charge trapping layer is changed, and thereby changing the threshold voltage of the memory cell. The operation of changing the threshold voltage of the memory cell is also called "writing data to the memory cell" or "programming the memory cell". Each memory cell in the rewritable non-volatile memory module 406 has a plurality of storage states according to the change of the threshold voltage. The storage state of the memory cell can be determined by applying a reading voltage, and thereby, obtaining the one or more bits stored in the memory cell.

In this exemplary embodiment, the memory cells of the rewritable non-volatile memory module 406 can constitute a plurality of physical programming units, and the physical programming units can constitute a plurality of physical erasing units. Specifically, the memory cells on the same word line form one physical programming unit or a plurality of physical programming units. If each of the memory cells stores two bits or more bits, the physical programming units on the same word line may at least be categorized as a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in a MLC NAND flash memory module, a writing speed of the lower physical programming unit may be greater than a writing speed of the upper physical programming unit, and/or reliability of the lower physical programming unit is greater than reliability of the upper physical programming unit.

In this exemplary embodiment, the physical programming unit is the smallest unit for programming. That is, the programming unit is the minimum unit for writing data. For example, the physical programming unit is a physical page or a physical sector. If the physical programming unit is the physical page, the physical programming units usually include a data bit region and a redundant bit region. The data bit region includes a plurality of physical sectors for storing user data, and the redundant bit region is configured for storing system data (e.g., management data such as an error correcting code). In this exemplary embodiment, the data bit region includes 32 physical sectors, and the size of each of the physical sectors is 512 bytes (B). However, in other exemplary embodiments, the data bit region may include 8, 16, or more or fewer physical sectors. A size of each of the physical sectors may be greater or smaller. On the other hand, the physical erasing unit is the minimum unit for erasing. Namely, each physical erasing unit contains the least number of memory cells to be erased together. The physical erase unit is a physical block, for example.

Figure 5:
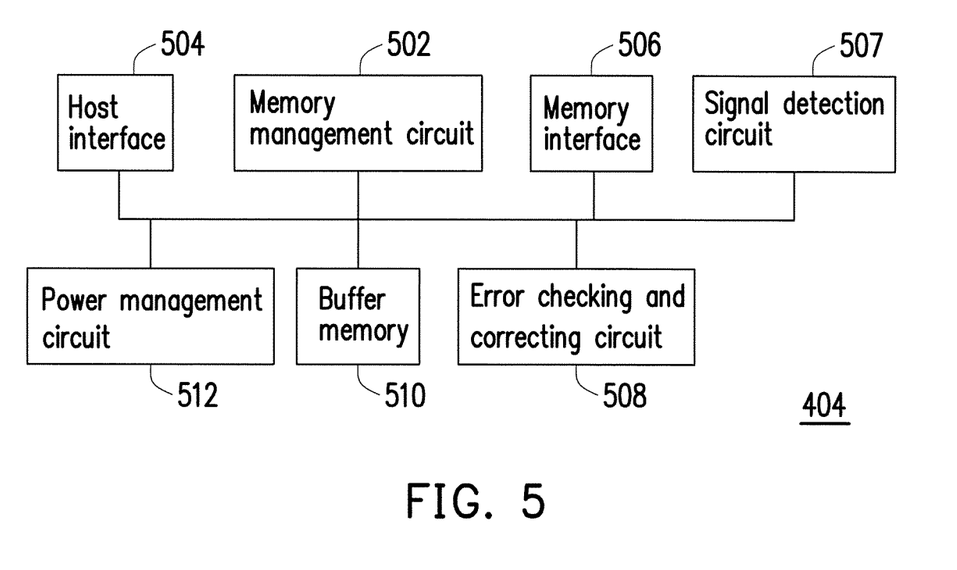
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure.

Referring to FIG. 5, the memory control circuit unit 404 includes a memory management circuit 502, a host interface 504, and a memory interface 506.

The memory management circuit 502 is configured to control overall operations of the memory control circuit unit 404. Specifically, the memory management circuit 502 has a plurality of control commands. When the memory storage device 10 is operated, the control commands are executed to perform various operations such as data writing, data reading, and data erasing. The following description of the operation of the memory management circuit 502 is equivalent to the description of the operation of the memory control circuit unit 404.

In this exemplary embodiment, control commands of the memory management circuit 502 are stored in a specific region (for example, a system region in the memory module exclusively used for storing system data) of the rewritable non-volatile memory module 406 in the form of firmware codes. For instance, the memory management circuit 502 has a microprocessor unit (not shown), a read only memory (not shown), and a random access memory (not shown). The read only memory stores a boot code. When the memory control circuit unit 404 is enabled, the boot code is first executed by the microprocessor unit for loading the control commands stored in the rewritable non-volatile memory module 406 to the random access memory of the memory management circuit 502. Afterwards, the microprocessor unit of the memory management circuit 502 executes the control commands for performing various data operations such as data writing, data reading, and data erasing.

In addition, in another exemplary embodiment, the memory management circuit 502 includes a micro controller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the micro controller. The memory management circuit is configured to manage the memory cells or the memory cell groups of the rewritable non-volatile memory module 406. The memory writing circuit is configured to issue a write command sequence to the rewritable non-volatile memory module 406 so as to write data into the rewritable non-volatile memory module 406. The memory reading circuit is configured to issue a read command sequence to the rewritable non-volatile memory module 406 so as to read data from the rewritable non-volatile memory module 406. The memory erasing circuit is configured to issue an erase command sequence to the rewritable non-volatile memory module 406 so as to erase data from the rewritable non-volatile memory module 406. The data processing circuit is configured to process data to be written into the rewritable non-volatile memory module 406 and data to be read from the rewritable non-volatile memory module 406. The write command sequence, the read command sequence, and the erase command sequence may respectively include one or more program codes or command codes and are configured to instruct the rewritable non-volatile memory module 406 to execute corresponding data operations such as data writing, data reading, and data erasing. In an exemplary embodiment, the memory management circuit 502 can further issue other types of command sequences to the rewritable non-volatile memory module 406 for instructing to execute corresponding operations.

The host interface 504 is coupled to the memory management circuit 502 and configured for receiving and identifying commands and data sent from the host system 11. In other words, the commands and the data sent from the host system 11 are sent to the memory management circuit 502 through the host interface 504. In this exemplary embodiment, the host interface 504 is compatible with the SATA standard. However, it should be understood that the disclosure is not limited thereto, and the host interface 504 may also be compatible to a PATA standard, an IEEE 1394 standard, a PCI Express standard, a USB standard, a SD standard, a UHS-I standard, a UHS-II standard, a MS standard, a MMC standard, an eMMC standard, a UFS standard, a CF standard, an IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted to a format acceptable to the rewritable non-volatile memory module 406 through the memory interface 506. Specifically, when the memory management circuit 502 is to access the rewritable non-volatile memory module 406, the memory interface 506 sends corresponding command sequences. For instance, the command sequences may include a write command sequence instructing data-writing, a read command sequence instructing data-reading, an erasing command sequence instructing data-erasing, and corresponding command sequences configured for instructing various memory operations (e.g., changing reading voltage levels or executing garbage collection, etc.). The command sequences are, for example, generated by the memory management circuit 502 and sent to the rewritable non-volatile memory module 406 through the memory interface 506. The command sequences may include one or more signals or data on the bus. The signals or the data may include command codes or program codes. For example, a read command sequence includes information, such as identification code and memory address, of the reading.

In an exemplary embodiment, the memory control circuit unit 404 further includes an error checking and correcting circuit 508, a buffer memory 510, and a power management circuit 512.

The error checking and correcting circuit 508 is coupled to the memory management circuit 502 and configured to execute an error checking and correcting operation to ensure the correctness of data. To be more specific, when the memory management circuit 502 receives a write command from the host system 11, the error checking and correcting circuit 508 generates a corresponding error correcting (ECC) code and/or an error detecting code (EDC) for the data corresponding to the write command, and the memory management circuit 502 writes the data corresponding to the write command and the corresponding error correcting code and/or the error detecting code to the rewritable non-volatile memory module 406. Afterward, when the memory management circuit 502 reads the data from the rewritable non-volatile memory module 406, the corresponding error correcting code and/or the error detecting code is also read simultaneously, and the error checking and correcting circuit 508 executes error checking and correcting operations for the read data based on the error correcting code and/or the error detecting code.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control power of the memory storage device 10.

It is noted that in the following description, some terms may be replaced with corresponding abbreviations for ease of reading (see Table 1).

TABLE 1

| rewritable non-volatile memory module | RNVM module |
|---|---|
| memory management circuit | MMC |

In an exemplary embodiment, the RNVM module 406 also stores a firmware code configured for establishing a connection with the host system 11. It should be noted that aforementioned firmware code configured for establishing the connection with the host system 11 practically may further include other functions, for example, booting and/or system initialization. The disclosure is not limited thereto. When a boot signal (e.g., powering on from the host system 11) is detected, the MMC 502 executes a boot code. In response to the execution of the boot code, the firmware code may also be loaded by the MMC 502 and executes. Then, the MMC 502 may attempt to establish the connection with the host system 11 based on the execution of the firmware code. If the connection between the memory storage device 10 and the host system 11 is successfully established, the MMC 502 is able to identify the commands from the host system 11, and the host system is able to transmit the commands to the memory storage device 10 based on the connection, so as to instruct the memory storage device 10 to execute operations of data writing, reading, and/or deleting. Nevertheless, if the connection between the memory storage device 10 and the host system 11 fails to be successfully established, the MMC 502 is unable to identify the commands from the host system 11.

In an exemplary embodiment, the memory control circuit unit 404 further includes a signal detection circuit 507. The signal detection circuit 507 is coupled to the MMC 502, the host interface 504, and the memory interface 506. The signal detection circuit 507 is configured to detect a signal stream (also referred to as a first signal stream) controlled by the host system 11. For instance, the first signal stream may be generated by the host system 11 and transmitted to the memory storage device 10 by at least one pin of the host interface 504. For instance, in an exemplary embodiment, the first signal stream may be transmitted by a reset pin of the host interface 504, and the first signal stream includes a reset signal from the host system 11. Alternatively, in an exemplary embodiment, the first signal stream is transmitted by a power pin of the host interface 504, and the first signal stream includes a power signal provided by the host system 11. In an exemplary embodiment, the power pin is configured to provide power to the RNVM module 406.

In an exemplary embodiment, the signal detection circuit 507 analyzes the signal stream from the host system 11. For instance, the signal stream is transmitted by a reset pin or a power pin of the memory storage device 10. If a pulse pattern of the signal stream meets a preset condition, the signal detection circuit 507 determines that the first signal stream is detected. For instance, the pulse pattern meeting the preset condition may be constituted by a plurality of pulses in the signal stream. Moreover, amplitudes, frequencies, waveforms, and/or pulse widths of these pulses are compatible to a preset rule. If the pulse pattern of the signal stream does not meet the preset condition, the signal detection circuit 507 does not determine that the first signal stream is detected.

In an exemplary embodiment, if the connection between the memory storage device 10 and the host system 11 is unable to be successfully established based on the executed firmware code, the host system 11 sends the first signal stream to the memory storage device 10. Furthermore, in another exemplary embodiment, the host system 11 may also send the first signal stream to the memory storage device 10 with correspondence to other conditions or based user operations. The disclosure is not limited thereto. For instance, in an exemplary embodiment, the host system 11 may send the first signal stream to the memory storage device 10 before the memory storage device 10 is shipped or when the memory storage device 10 is returned for repair.

After the first signal stream is detected by the signal detection circuit 507, the MMC 502 executes the boot code according to the first signal stream and enters a boot code mode. Nevertheless, the MMC 502 receives a command from the host system 11 in the boot code mode and performs operations corresponding to the command.

Nevertheless, it should be noted that if the boot code is executed according to the detected first signal stream, after the boot code is executed, the MMC 502 does not continue to execute the firmware code stored in the RNVM module 406. In other words, after the first signal stream is detected by the signal detection circuit 507, the MMC 502 enters and remains in the boot code mode and does not execute the firmware code used for establishing the connection with the host system 11.

In an exemplary embodiment, after entering the boot code mode based on the first signal stream, the MMC 502 establishes a connection with the host system 11 in the boot code mode. If the connection between the memory storage device 10 and the host system 11 is successfully established in the boot code mode, the host system 11 may transmit a command to the memory storage device 10 based on the established connection. Moreover, the MMC 502 can identify the command from the host system 11 in the boot code mode based on the established connection. For instance, in an exemplary embodiment, based on the connection established in the boot code mode, the host system 11 may transmit a command configured for updating the firmware code stored in the RNVM module 406, a command configured for adjusting a setting parameter of the memory storage device 10, or other types of commands. The MMC 502 may perform corresponding operations according to the command received in the boot code mode, for example, updating the firmware code, adjusting the setting parameter, and/or correcting error information. In an exemplary embodiment, after performing firmware code update, setting parameter adjustment, and/or performing error information correction according to the received command, when the memory storage device 10 is activated next time, a connection between the memory storage device 10 and the host system 11 may be successfully established based on the firmware code loaded and executed. As such, after the memory storage device 10 is activated next time, the MMC 502 may not enter and/or may not remain in the boot code mode.

In an exemplary embodiment, if the firmware code is not stored in the RNVM module 406, the firmware code in the RNVM module 406 is damaged, or a parameter setting in the firmware code is incorrect, the boot code mode is being remained and the firmware code in the RNVM module 406 is not executed, such that error procedures, for example, the connection between the memory storage device 10 and the host system 11 fails to be established and/or the memory storage device 10 fails to be booted may be prevented from repeatedly happening. On the contrary, if the connection between the memory storage device 10 and the host system 11 is successfully established based on the executed firmware code, the memory storage device 10 may not have to enter the boot code mode.

Figure 6:
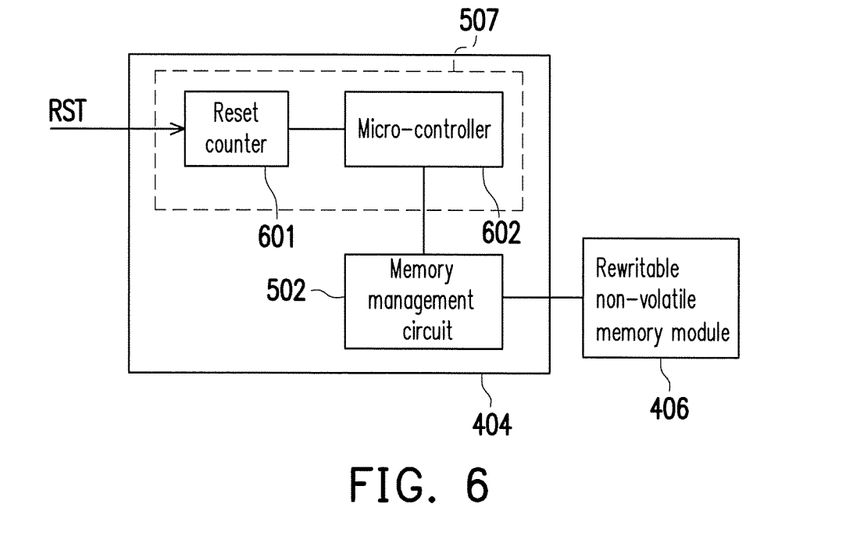
FIG. 6 is a schematic diagram illustrating a signal detection circuit according to an exemplary embodiment of the disclosure.

FIG. 6 is a schematic diagram illustrating a signal detection circuit according to an exemplary embodiment of the disclosure.

Referring to 6, in this exemplary embodiment, the signal detection circuit 507 may detect a reset signal RST with a specific pattern. Herein, the reset signal RST with the specific pattern is the first signal stream. If the reset signal RST with the specific pattern is detected, the signal detection circuit 507 sends a notification signal to the MMC 502. The MMC 502 executes the boot code according to the notification signal. Next, the MMC 502 enters and stays in the boot code mode.

In an exemplary embodiment, each time an effective pulse in the reset signal RST is detected, the MMC 502 performs system reset for one time according to the effective pulse. Herein, the effective pulse refers to a pulse with an amplitude greater than a preset value, so as to be distinguished from a noise in the signal. For instance, it is assumed that the first signal stream is formed by 4 continuous or discontinuous effective pules in the reset signal RST, and that the MMC 502 may perform system reset for 4 times according to the 4 effective pulses respectively. It should be noted that in the first 3 times of performing system reset, the MMC 502 executes the boot code every time and then continues to execute the firmware code stored in the RNVM module 406. Nevertheless, in the 4th time of performing the system reset, since the reset signal RST with the specific pattern is detected, the MMC 502 remains in the boot code mode after executing the boot code and does not execute the firmware code stored in the RNVM module 406.

In an exemplary embodiment, the signal detection circuit 507 includes a reset counter 601 and a micro controller 602. The reset counter 601 is coupled to the micro controller 602. The reset counter 601 is configured to detect occurrence and/or frequency of the effective pulses in the reset signal RST. For instance, the reset counter 601 may sample the reset signal RST by using a clock signal and send a sampling result to the micro controller 602. The micro controller 602 determines whether the first signal stream is detected according to the detection result of the reset counter 601. For instance, the micro controller 602 may determine whether the pulse pattern of the reset signal RST meets a preset condition according to the detection result of the reset counter 601. If the reset signal RST meets the preset condition, the micro controller 602 determines that the first signal stream is detected. Otherwise, it is determined that the first signal stream is not detected.

Figure 7:
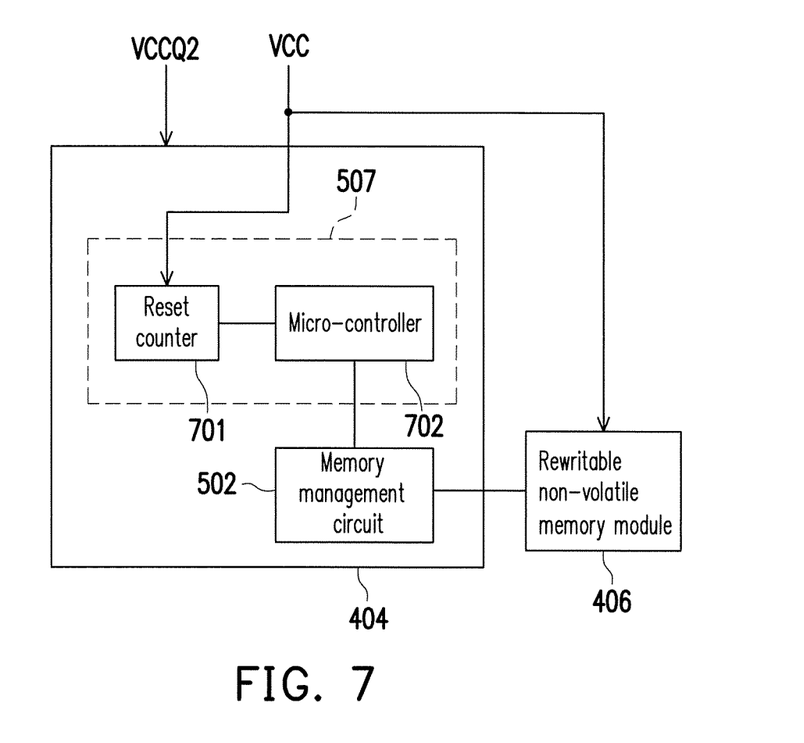
FIG. 7 is a schematic diagram illustrating a signal detection circuit according to another exemplary embodiment of the disclosure.

FIG. 7 is a schematic diagram illustrating a signal detection circuit according to another exemplary embodiment of the disclosure.

Referring to FIG. 7, in this exemplary embodiment, the signal detection circuit 507 may detect a power signal VCC with a specific pattern. Herein, the power signal VCC with the specific pattern is the first signal stream. For instance, in this exemplary embodiment, the power detection circuit 507 includes a reset counter 701 and a micro controller 702. The reset counter 701 and the micro controller 702 are respectively identical to or similar to the reset counter 601 and the micro controller 602, and relevant description thereof is thus omitted. If the power signal VCC with the specific pattern is detected, the signal detection circuit 507 sends a notification signal to the MMC 502. The MMC 502 executes the boot code according to the notification signal so as to enter and remain (or stay) in the boot code mode.

In an exemplary embodiment, each time one effective pulse in the power signal VCC is detected, the MMC 502 performs system reset for one time according to the effective pulse. Alternatively, in an exemplary embodiment, the MMC 502 performs the system reset (only) after the power signal VCC with the specific pattern (i.e., the first signal stream) is identified rather than performs the system reset according to each effective pulse in the power signal VCC.

It should be noted that in this exemplary embodiment, the power signal VCC is configured to provide power to the RNVM module 406, and a power signal VCCQ2 provides power to the memory control circuit unit 404. For instance, a logic high voltage level of the power signal VCC may be approximately 3.3 volts, and a logic high voltage level of the power signal VCCQ2 may be approximately 1.8 volts. Nevertheless, the disclosure is not limited thereto. In addition, a transmission path of the power signal VCC is different from a transmission path of the power signal VCCQ 2. In an exemplary embodiment, the signal detection circuit 507 analyzes the power signal VCC for detecting the first signal stream rather than analyzes the power signal VCCQ 2.

Figure 8:
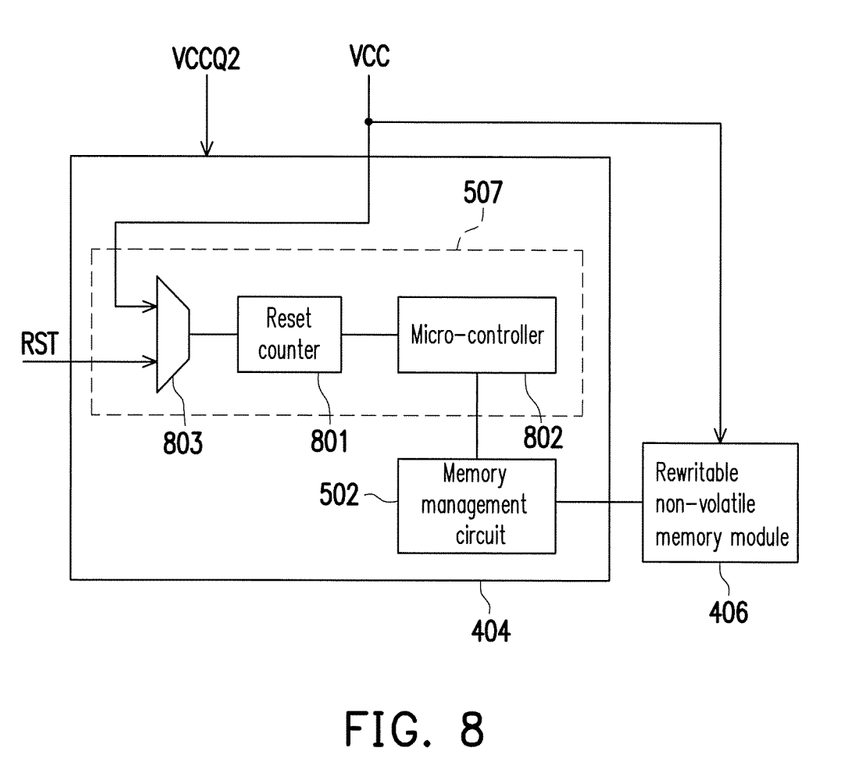
FIG. 8 is a schematic diagram illustrating a signal detection circuit according to another exemplary embodiment of the disclosure.

FIG. 8 is a schematic diagram illustrating a signal detection circuit according to another exemplary embodiment of the disclosure.

Referring to FIG. 8, in this exemplary embodiment, the signal detection circuit 507 may selectively analyze the reset signal RST or the power signal VCC for detecting the first signal stream. For instance, in this exemplary embodiment, the power detection circuit 507 includes a reset counter 801, a micro controller 802, and a multiplexer 803. The reset counter 801 and the micro controller 802 are respectively identical to or similar to the reset counter 601 and the micro controller 602, and a relevant description thereof is thus omitted. The multiplexer 803 is configured to selectively transmit one of the reset signal RST and the power signal VCC to the reset counter 801. In other words, in the exemplary embodiment of FIG. 8, the host system 11 may control the reset signal RST or the power signal VCC for transmitting the first signal stream. In addition, the signal detection circuit 507 may determine to analyze the reset signal RST or to analyze the power signal VCC according to whether the reset signal RST (or the power signal VCC) is able to be obtained.

In an exemplary embodiment, if the memory storage device 10 (or the host interface 504) has a reset pin, the host system 11 may transmit the reset signal RST containing the first signal stream to the memory storage device 10 through the reset pin. Under the circumstance, the micro controller 802 may instruct the multiplexer 803 to allow the reset signal RST to pass through. Alternatively, in an exemplary embodiment, if the memory storage device 10 (or the host interface 504) does not have the reset pin, the host system 11 may transmit the power signal VCC containing the first signal stream to the memory storage device 10 through a power pin. Under the circumstance, the micro controller 802 may instruct the multiplexer 803 to allow the power signal VCC to pass through.S It should be noted that circuit elements and structures of FIG. 4 to FIG. 8 are merely exemplary and should not be construed as limitations of the disclosure. In the embodiments that are not mentioned, in FIG. 4 to FIG. 8, coupling relationships of at least part of the circuit elements may be changed. Part of the circuit elements in FIG. 4 to FIG. 8 may be replaced by circuit elements having identical or similar functions, and/or more circuit elements may be added to provide additional functions depending on requirements in practice.

Figure 9A:
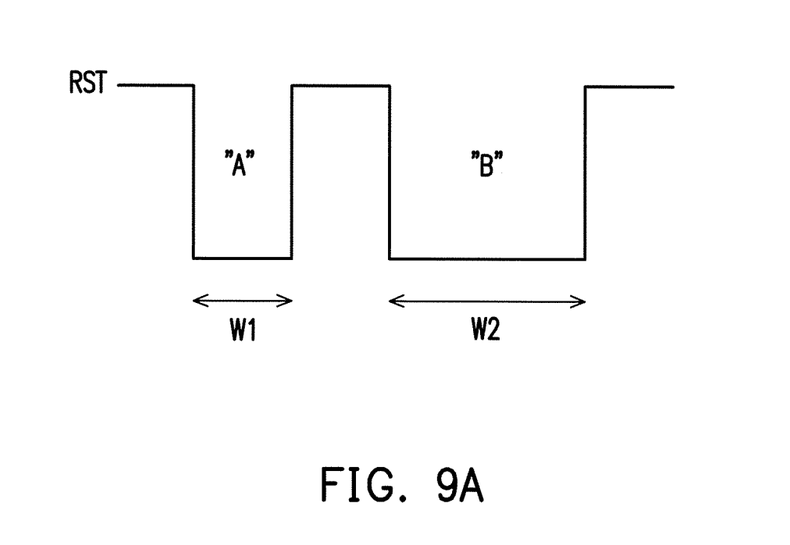
FIG. 9A is a schematic diagram illustrating a reset signal according to an exemplary embodiment of the disclosure.

FIG. 9A is a schematic diagram illustrating a reset signal according to an exemplary embodiment of the disclosure. Referring to FIG. 9A, the reset signal RST may contain two types of effective pulses respectively correspond to a message A and a message B. Herein, the effective pulse corresponding to the message A has a pulse width W1, the effective pulse corresponding to the message B has a pulse width W2, and the pulse width W1 is different from the pulse width W2. In an exemplary embodiment, the pulse width W2 is, for example, two times greater than the pulse width W1. Nevertheless, the disclosure is not limited thereto.

Figure 9B:
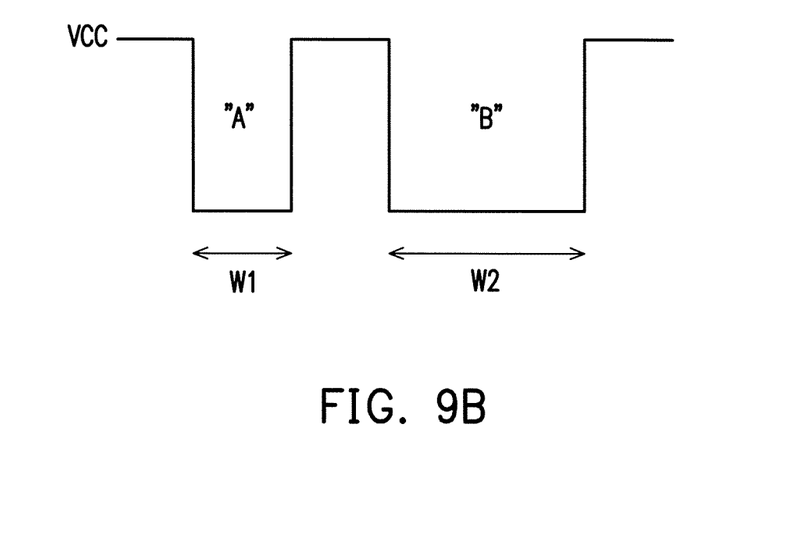
FIG. 9B is a schematic diagram illustrating a power signal according to an exemplary embodiment of the disclosure.

FIG. 9B is a schematic diagram illustrating a power signal according to an exemplary embodiment of the disclosure.

Referring to FIG. 9B, the power signal VCC may also contain two types of effective pulses respectively correspond to the message A and the message B. The effective pulse corresponding to the message A has the pulse width W1, the effective pulse corresponding to the message B has the pulse width W2, and the pulse width W1 is different from the pulse width W2. In an exemplary embodiment, the pulse width W2 is, for example, two times greater than the pulse width W1. Nevertheless, the disclosure is not limited thereto.

Figure 9C:
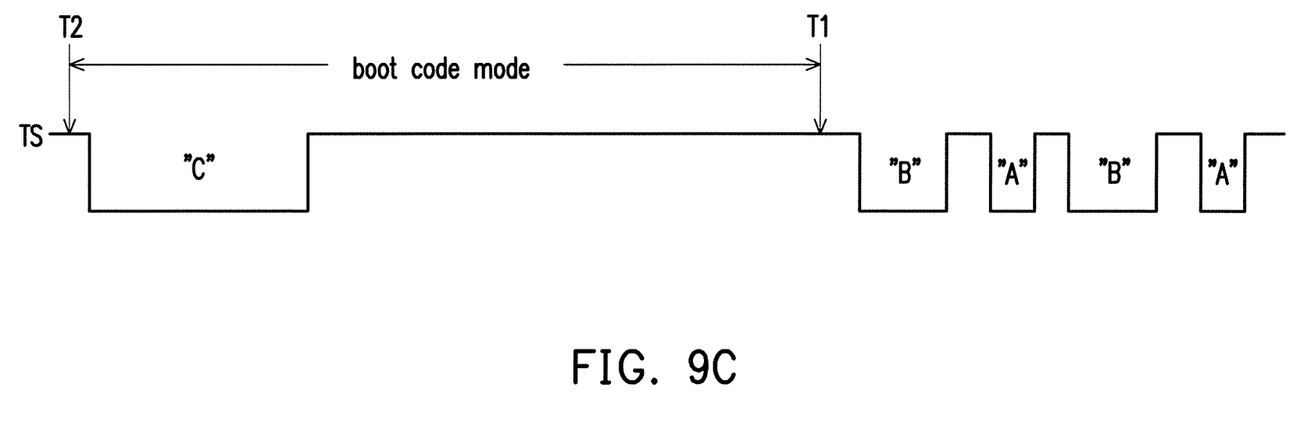
FIG. 9C is a schematic diagram illustrating a signal stream according to an exemplary embodiment of the disclosure.

FIG. 9C is a schematic diagram illustrating a signal stream according to an exemplary embodiment of the disclosure.

Referring to FIG. 9C, it is assumed that a signal stream TS (may be the reset signal or the power signal) sequentially transmits 4 effective pulses corresponding to the messages A-B-A-B, and a pulse pattern constituted by the 4 effective pulses meets the preset condition. After the 4 effective pulses (i.e., the first signal stream) are detected, in a time point T1, the memory storage device 10 enters and remains in the boot code mode. After relevant operations in the boot code mode are completed, the host system 11 controls the signal stream TS to transmit an effective pulse corresponding to a message C. For instance, a pulse width of the effective pulse corresponding to the message C is different from the pulse widths W1 and W2 in FIG. 9A and FIG. 9B. After the effective pulse corresponding to the message C is detected, in a time point T 2, the memory storage device 10 exits the boot code mode. For instance, after exiting the boot code mode, the memory storage device 10 may be re-activated (e.g., re-booted). In an activation process (e.g., a boot process), the boot code and the firmware ware code stored in the RNVM module 406 may be sequentially loaded and executed.

It should be noted that even though in the exemplary embodiments of FIG. 9A to FIG. 9C, messages are transmitted with correspondence to changes of the pulse widths of each of the effective pulses of the first signal stream, in another exemplary embodiment, messages may also be transmitted with correspondence to electrical property changes such as changes of amplitudes, frequencies, waveforms of each of the effective pulses in the first signal stream. The disclosure is not limited thereto. In an exemplary embodiment, the effective pulses in the first signal stream may be configured to transmit Morse code or other coded messages. The disclosure is not limited thereto.

In an exemplary embodiment, the operation of analyzing the effective pulse(s) in a signal stream (e.g., the reset signal or the power signal) may also be regarded as an operation of analyzing the signal stream so as to obtain a message contained in the signal stream. If the contained message is compatible with a preset message content, it can be determined that the first signal stream is detected. Otherwise, if the contained message is not compatible with the preset message content, it can be determined that the first signal stream is not detected.

Figure 10:
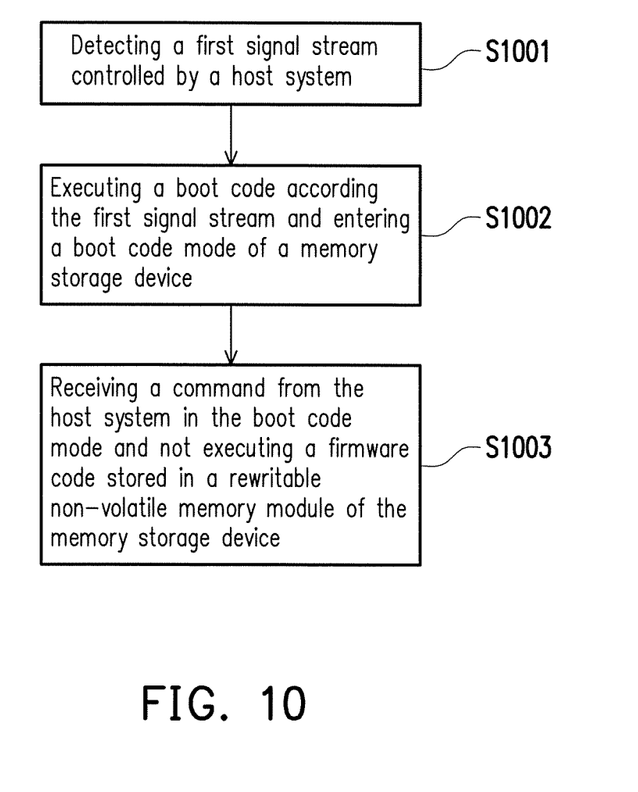
FIG. 10 is a flowchart illustrating a control method of a memory storage device according to an exemplary embodiment of the disclosure.

FIG. 10 is a flowchart illustrating a control method of a memory storage device according to an exemplary embodiment of the disclosure.

Referring to FIG. 10, in step S1001, a first signal stream controlled by a host system is detected. In step S1002, a boot code is executed according the first signal stream and a boot code mode of a memory storage device is entered. In step S1003, a command from the host system is received in the boot code mode and a firmware code stored in a RNVM module of the memory storage device is not executed.

Figure 11:
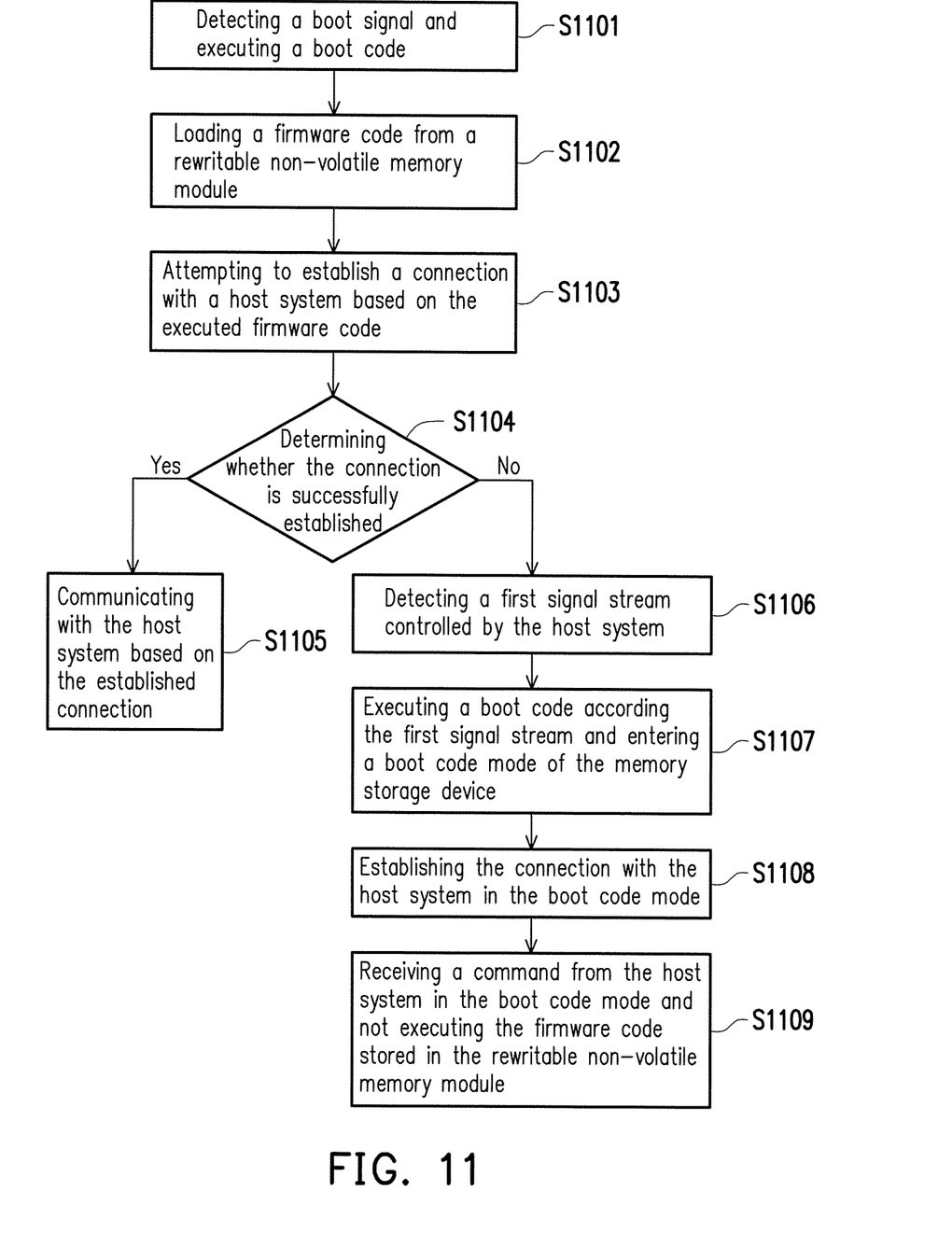
FIG. 11 is a flowchart illustrating a control method of a memory storage device according to another exemplary embodiment of the disclosure.

FIG. 11 is a flowchart illustrating a control method of a memory storage device according to another exemplary embodiment of the disclosure.

Referring to FIG. 11, in step S1101, a boot signal is detected and a boot code is executed. In step S1102, a firmware code is loaded from a RNVM module of a memory storage device and executed. In step S1103, a connection with a host system is attempted to be established based on the execution of the firmware code. In step S1104, it is determined whether the connection is successfully established. If the connection is successfully established, in step S1105, communication can be made with the host system based on the established connection. If the connection is unable to be established, in step S1106, a first signal stream controlled by the host system is detected. In step S1107, a boot code is executed according the first signal stream and a boot code mode of the memory storage device is entered. In step S1108, the connection with the host system is established in the boot code mode. In step S1109, a command from the host system is received in the boot code mode and the firmware code stored in the RNVM module is not executed.

Nevertheless, each step of FIG. 10 and FIG. 11 has been specified as above and thus is not repeated hereinafter. It should be noted that each step of FIG. 10 and FIG. 11 may be implemented as a plurality of program codes or circuits. The disclosure is not limited thereto. In addition, the method of FIG. 10 and FIG. 11 may be used in combination with the above-described exemplary embodiments or be used solely. The disclosure is not limited thereto.

In view of the foregoing, after the first signal stream controlled by the host system is detected, the memory storage device executes the boot code and enters the boot code mode. Next, the memory storage device may receive and identify the command from the host system in the boot code mode. Particularly, after entering the boot code mode based on the first signal stream, the firmware code stored in the RNVM module of the memory storage device is not executed, so as to prevent the influence due to the damaged firmware code or the firmware code which is yet to be setup. As such, the memory storage device can be controlled with more flexibility to update or debug the firmware code in the boot code mode.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A memory control circuit unit configured to control a memory storage device, the memory control circuit unit comprising:
a host interface, configured to be coupled to a host system;
a memory interface, configured to be coupled to a rewritable non-volatile memory module of the memory storage device;
a signal detection circuit disposed in the memory control circuit unit; and
a memory management circuit, coupled to the host interface, the memory interface, and the signal detection circuit,
wherein the signal detection circuit is configured to detect a first signal stream controlled by the host system in a situation that the memory storage device is powered on and a boot of the memory storage device is successful by executing a firmware code stored in the rewritable non-volatile memory module but a connection between the memory storage device and the host system cannot be established by the executing of the firmware code,
wherein the memory management circuit is configured to execute a boot code according to the first signal stream and enter a boot code mode,
wherein the memory management circuit is further configured to receive a command from the host system in the boot code mode and not to execute the firmware code stored in the rewritable non-volatile memory module after entering the boot code mode, wherein the firmware code is configured to provide a function of booting of the memory storage device.

2. The memory control circuit unit as claimed in claim 1, wherein the memory management circuit is further configured to establish a connection with the host system in the boot code mode after entering the boot code mode.

3. The memory control circuit unit as claimed in claim 1, wherein the memory management circuit is further configured to load the firmware code from the rewritable non-volatile memory module and attempt to establish a connection with the host system based on an execution of the firmware code before the signal detection circuit detects the first signal stream.

4. The memory control circuit unit as claimed in claim 3, wherein the operation of detecting the first signal stream by the signal detection circuit is performed after the memory management circuit fails to establish the connection with the host system based on the execution of the firmware code.

5. The memory control circuit unit as claimed in claim 1, wherein the first signal stream is transmitted through a reset pin between the memory storage device and the host system.

6. The memory control circuit unit as claimed in claim 1, wherein the first signal stream is transmitted through a power pin of the memory storage device.

7. The memory control circuit unit as claimed in claim 6, wherein the power pin is configured to provide power to the rewritable non-volatile memory module.

8. The memory control circuit unit as claimed in claim 1, wherein the signal detection circuit comprises:
a reset counter, configured to detect a specific pulse in a signal stream from the host system; and
a micro controller, coupled to the reset counter and configured to determine whether the first signal stream is detected according to a detection result of the reset counter.

9. The memory control circuit unit as claimed in claim 1, wherein the memory management circuit is further configured to execute a system reset for at least one time according to the first signal stream.

10. A memory storage device, comprising:
a connection interface unit, coupled to a host system;
a rewritable non-volatile memory module; and
a memory control circuit unit, coupled to the connection interface unit and the rewritable non-volatile memory module,
wherein the memory control circuit unit comprises a signal detection circuit that is disposed in the memory control circuit unit and is configured to detect a first signal stream controlled by the host system in a situation that the memory storage device is powered on and a boot of the memory storage device is successful by executing a firmware code stored in the rewritable non-volatile memory module but a connection between the memory storage device and the host system cannot be established by the executing of the firmware code,
wherein the memory control circuit unit is further configured to execute a boot code according to the first signal stream and enter a boot code mode,
wherein the memory control circuit unit is further configured to receive a command from the host system in the boot code mode and not to execute the firmware code stored in the rewritable non-volatile memory module after entering the boot code mode, wherein the firmware code is configured to provide a function of booting of the memory storage device.

11. The memory storage device as claimed in claim 10, wherein the memory control circuit unit is further configured to establish a connection with the host system in the boot code mode after entering the boot code mode.

12. The memory storage device as claimed in claim 10, wherein the memory control circuit unit is further configured to load the firmware code from the rewritable non-volatile memory module and attempt to establish a connection with the host system based on an execution of the firmware code before detecting the first signal stream.

13. The memory storage device as claimed in claim 12, wherein the operation of detecting the first signal stream by the memory control circuit unit is performed after the memory control circuit unit fails to establish the connection with the host system based on the execution of the firmware code.

14. The memory storage device as claimed in claim 10, wherein the first signal stream is transmitted through a reset pin of the connection interface unit.

15. The memory storage device as claimed in claim 10, wherein the first signal stream is transmitted through a power pin of the memory storage device.

16. The memory storage device as claimed in claim 15, wherein the power pin is configured to provide power to the rewritable non-volatile memory module.

17. The memory storage device as claimed in claim 10, wherein the memory control circuit unit comprises a signal detection circuit,
wherein the signal detection circuit is configured to detect a specific pulse in a signal stream from the host system to determine whether the first signal stream is detected.

18. The memory storage device as claimed in claim 10, wherein the memory control circuit unit is further configured to execute a system reset for at least one time according to the first signal stream.

19. A control method for controlling a memory storage device comprising a rewritable non-volatile memory module, the control method comprising:
   detecting, by a signal detection circuit disposed in the memory storage device, a first signal stream controlled by a host system in a situation that the memory storage device is powered on and a boot of the memory storage device is successful by executing a firmware code stored in the rewritable non-volatile memory module but a connection between the memory storage device and the host system cannot be established by the executing of the firmware code;
   executing a boot code according to the first signal stream and entering a boot code mode of the memory storage device; and
   receiving a command from the host system in the boot code mode and not executing the firmware code stored in the rewritable non-volatile memory module after entering the boot code mode, wherein the firmware code is configured to provide a function of booting of the memory storage device.

20. The control method as claimed in claim 19, further comprising:
   establishing a connection with the host system in the boot code mode after entering the boot code mode.

21. The control method as claimed in claim 19, further comprising:
   loading the firmware code from the rewritable non-volatile memory module and attempting to establish a connection with the host system based on an execution of the firmware code before detecting the first signal stream.

22. The control method as claimed in claim 21, wherein the step of detecting the first signal stream controlled by the host system is performed after the connection with the host system is failed to be established based on the execution of the firmware code.

23. The control method as claimed in claim 19, wherein the first signal stream is transmitted through a reset pin between the memory storage device and the host system.

24. The control method as claimed in claim 19, wherein the first signal stream is transmitted through a power pin of the memory storage device.

25. The control method as claimed in claim 24, wherein the power pin is configured to provide power to the rewritable non-volatile memory module.

26. The control method as claimed in claim 19, wherein the step of detecting the first signal stream controlled by the host system comprising:
   analyzing a signal stream from the host system; and
   determining that the first signal stream is detected if a pulse pattern of the signal stream meets a preset condition.

27. The control method as claimed in claim 19, further comprising:
   executing a system reset of the memory storage device for at least one time according to the first signal stream.

* * * * *